US009226395B2

(12) United States Patent
Ihara (10) Patent No.: US 9,226,395 B2
(45) Date of Patent: Dec. 29, 2015

(54) PRINTED CIRCUIT BOARD AND METHOD OF MANUFACTURING THE SAME

(71) Applicant: Terukazu Ihara, Ibaraki (JP)

(72) Inventor: Terukazu Ihara, Ibaraki (JP)

(73) Assignee: NITTO DENKO CORPORATION, Ibaraki-shi, Osaka (JP)

(*) Notice: Subject to any disclaimer, the term of this patent is extended or adjusted under 35 U.S.C. 154(b) by 161 days.

(21) Appl. No.: 13/683,717

(22) Filed: Nov. 21, 2012

(65) Prior Publication Data

US 2013/0206458 A1    Aug. 15, 2013

Related U.S. Application Data

(60) Provisional application No. 61/608,337, filed on Mar. 8, 2012.

(30) Foreign Application Priority Data

Feb. 10, 2012   (JP) .................................. 2012-027545

(51) Int. Cl.
| | |
|---|---|
| *G11B 5/48* | (2006.01) |
| *H05K 1/02* | (2006.01) |
| *H05K 3/00* | (2006.01) |
| *H05K 1/05* | (2006.01) |

(52) U.S. Cl.
CPC .............. *H05K 1/0298* (2013.01); *H05K 1/056* (2013.01); *H05K 3/0058* (2013.01); *H05K 2201/0191* (2013.01); *H05K 2201/2009* (2013.01); *Y10T 29/49146* (2015.01)

(58) Field of Classification Search
CPC ... H05K 1/0298; H05K 3/0058; H05K 1/056; H05K 2201/0191; H05K 2201/2209; H05K 3/4092; H05K 3/243; H05K 2201/0969; H05K 2201/0394; Y10T 29/49146; G11B 5/486
See application file for complete search history.

(56) References Cited

U.S. PATENT DOCUMENTS

| | | | |
|---|---|---|---|
| 6,252,176 B1 * | 6/2001 | Kuramochi et al. .......... 174/255 |
| 6,480,359 B1 * | 11/2002 | Dunn et al. ................ 360/245.9 |
| 8,609,992 B2 * | 12/2013 | Chiyonaga et al. ........... 174/254 |
| 2003/0026078 A1 * | 2/2003 | Komatsubara et al. ....... 361/746 |
| 2003/0193753 A1 * | 10/2003 | Arai et al. .................. 360/245.8 |
| 2004/0125489 A1 * | 7/2004 | Maruyama et al. ............. 360/75 |
| 2004/0173822 A1 * | 9/2004 | Dutta ............................ 257/208 |
| 2005/0122627 A1 * | 6/2005 | Kanagawa et al. ........ 360/245.9 |
| 2007/0170911 A1 * | 7/2007 | Ohsawa et al. ............ 324/158.1 |

(Continued)

FOREIGN PATENT DOCUMENTS

| | | |
|---|---|---|
| JP | 2010-108575 A | 5/2010 |
| JP | 2010-108576 A | 5/2010 |
| JP | 2011-103357 A | 5/2011 |

OTHER PUBLICATIONS

English translation of WO2011/078355 published Jun. 30, 2011.*

(Continued)

*Primary Examiner* — Steven T Sawyer
(74) *Attorney, Agent, or Firm* — Panitch Schwarze Belisario & Nadel LLP (57) ABSTRACT

In a suspension board, a conductor layer having a predetermined pattern is formed on the upper surface of a first insulating layer. The first insulating layer has a thick portion having a large thickness and a thin portion having a small thickness. A reinforcing layer is formed on the upper surface of the first insulating layer so as to overlap with a boundary between the thick portion and the thin portion.

10 Claims, 7 Drawing Sheets

(56) References Cited

U.S. PATENT DOCUMENTS

2010/0033875 A1\* 2/2010 Yoshida et al. ............ 360/244.1
2010/0110590 A1 5/2010 Ohsawa et al.
2010/0110649 A1 5/2010 Ohsawa et al.

OTHER PUBLICATIONS

Japanese Office Action Issued Jul. 21, 2015 in Japanese Application No. 2012-027545.

\* cited by examiner

PRINTED CIRCUIT BOARD AND METHOD OF MANUFACTURING THE SAME

BACKGROUND OF THE INVENTION (1) Field of the Invention

The present invention relates to a printed circuit board and a method of manufacturing the same.

(2) Description of Related Art

Actuators are used in drives such as hard disc drives. Such an actuator includes an arm provided rotatably around a rotation shaft, and a suspension board for a magnetic head that is attached to the arm. The suspension board is a printed circuit board for positioning the magnetic head at a desired track of a magnetic disc.

In JP 2010-108575 A and JP 2010-108576 A, a suspension board that includes a metal support substrate, a base insulating layer, and conductor traces is discussed. In the suspension board, the base insulating layer is formed on the metal support substrate. Further, the conductor traces having a predetermined pattern are formed on the base insulating layer.

BRIEF SUMMARY OF THE INVENTION

The thickness of part of a base insulating layer may be set smaller in order to reduce dielectric loss in conductor traces of a suspension board. In this case, a step is formed by the portion having a large thickness and the portion having a small thickness at the base insulating layer. Because stress is easily concentrated at the step, damage such as a crack is more likely to occur.

An object of the present invention is to provide a printed circuit board in which damage at a step of an insulating layer is prevented from occurring and a method of manufacturing the printed circuit board.

(1) According to an aspect of the present invention, a printed circuit board includes a first insulating layer that has first and second surfaces and includes a first portion and a second portion having a smaller thickness than a thickness of the first portion, a conductor layer that is formed on the first surface of the first insulating layer and has a predetermined pattern, and a reinforcing layer that is formed in a partial region on the first surface of the first insulating layer so as to overlap with a boundary between the first portion and the second portion.

In the printed circuit board, the thickness of the second portion is smaller than that of the first portion. In this case, a step is formed at the boundary between the first portion and the second portion. Because stress is easily concentrated at the step, damage is more likely to occur.

The reinforcing layer is formed in the partial region on the first surface of the first insulating layer so as to overlap with the boundary between the first portion and the second portion. Thus, the boundary between the first portion and the second portion, and its peripheral portion of the first insulating layer are reinforced by the reinforcing layer. As a result, the stress to be concentrated at the step is distributed by the reinforcing layer, so that the damage is prevented from occurring at the step of the first insulating layer.

(2) The partial region on the first surface of the first insulating layer may be formed to be flat, and a step caused by the boundary between said first portion and said second portion may be formed on the second surface of the first insulating layer.

In this case, the reinforcing layer is formed to be flat. Thus, the reinforcing layer can easily be formed on the first surface of the first insulating layer. Additionally, the step is not formed at the reinforcing layer. Therefore the damage is prevented from occurring at the reinforcing layer.

(3) At least part of the conductor layer may be formed so as to overlap with the second portion.

In this case, at least part of the conductor layer overlaps with the second portion of the first insulating layer having a smaller thickness. Therefore, the dielectric loss in the conductor layer can be reduced.

(4) At least part of the conductor layer may be formed in another region excluding the partial region on one surface of the first insulating layer so as to overlap with the boundary between the first portion and the second portion.

In this case, the step at the first insulating layer is reinforced by the reinforcing layer and the conductor layer. As a result, the damage is more sufficiently prevented from occurring at the step of the first insulating layer.

(5) The reinforcing layer may include polyimide resin.

In this case, the reduction of flexibility of the printed circuit board is suppressed.

(6) The reinforcing layer may include copper.

In this case, the first insulating layer is prevented from being bent at the boundary between the first portion and the second portion. As a result, the damage is more sufficiently prevented from occurring at the step of the first insulating layer.

(7) The printed circuit board may further include a support substrate that is provided on the second surface of the first insulating layer to support the first insulating layer, and the conductor layer may be configured to be electrically connectable to a magnetic head.

In this case, the printed circuit board can be used as a suspension board for a drive such as a hard disc drive.

(8) According to another aspect of the present invention, a method of manufacturing a printed circuit board includes the steps of forming a conductor layer that has a predetermined pattern on a first surface of a first insulating layer having the first surface and a second surface, processing the first insulating layer to form a first portion and a second portion having a smaller thickness than a thickness of the first portion, and forming a reinforcing layer in a partial region on the first surface of the first insulating layer so as to overlap with a boundary between the first portion and the second portion.

In the method of manufacturing the printed circuit board, the conductor layer that has the predetermined pattern is formed on the first surface of the first insulating layer having the first and second surfaces. Further, the first insulating layer is processed such that the first portion and the second portion having a smaller thickness than that of the first portion are formed. Further, the reinforcing layer is formed in the partial region on the first surface of the first insulating layer so as to overlap with the boundary between the first portion and the second portion.

In the printed circuit board fabricated as described above, the thickness of the second portion is smaller than that of the first portion. In this case, a step is formed at the boundary between the first portion and the second portion. Because stress is easily concentrated at the step, damage is more likely to occur.

The reinforcing layer is formed in the partial region of the first surface of the first insulating layer so as to overlap with the boundary between the first portion and the second portion. Thus, the boundary between the first portion and the second portion in the first insulating layer and its peripheral portion are reinforced by the reinforcing layer. As a result, the stress to be concentrated at the step is distributed by the reinforcing layer, so that the damage is prevented from occurring at the step of the first insulating layer.

(9) The step of processing the first insulating layer may include the step of forming the second portion and an opening so as to overlap with at least part of the conductor layer by etching a predetermined region of the second surface of the first insulating layer.

In this case, at the time of processing the first insulating layer, the predetermined region of the second surface of the first insulating layer is etched. Therefore, the thickness of the etched portion of the first insulating layer becomes smaller than another portion, so that the first and second portions are formed. The opening and the second portion are formed so as to overlap with at least part of the conductor layer. Thus, dielectric loss in the conductor layer can be more sufficiently reduced.

(10) The method of processing the first insulating layer may include the step of forming the second portion so as to overlap with at least part of the conductor layer by etching a predetermined region of the second surface of the first insulating layer.

In this case, at the time of processing the first insulating layer, the predetermined region of the second surface of the first insulating layer is etched. Thus, the thickness of the etched portion of the first insulating layer becomes smaller than that of another portion, so that the first and second portions are formed. The second portion is formed so as to overlap with at least part of the conductor layer. As a result, the dielectric loss in the conductor layer can be reduced.

(11) The method of manufacturing the printed circuit board may further include the step of forming a second insulating layer on the first surface of the first insulating layer so as to cover part of the conductor layer, and the reinforcing layer may be formed of the same material as the second insulating layer, and the step of forming the second insulating layer and the step of forming the reinforcing layer may be performed simultaneously.

In this case, at the time of manufacturing the printed circuit board, the reinforcing layer can be formed in the same step as the second insulating layer. Therefore, at the time of manufacturing the printed circuit board, it is not necessary to provide the step for forming the reinforcing layer separately. Thus, an increase in the number of manufacturing steps and the production cost due to the formation of the reinforcing layer is prevented.

(12) The reinforcing layer may be formed of the same material as the conductor layer, and the step of forming the conductor layer and the step of forming the reinforcing layer may be performed simultaneously.

In this case, at the time of manufacturing the printed circuit board, the reinforcing layer can be formed in the same step as the conductor layer. Thus, at the time of manufacturing the printed circuit board, it is not necessary to provide the step for forming the reinforcing layer separately. As a result, an increase in the number of manufacturing steps and the production cost due to the formation of the reinforcing layer is prevented.

According to the present invention, the damage is prevented from occurring at the step of the insulating layer in the printed circuit board.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 4 (a) to 4 (d) are vertical cross sectional views showing the steps of manufacturing the suspension board according to the one embodiment of the present invention;

FIG. 5 (a) to 5 (c) are vertical cross sectional views showing the steps of manufacturing the suspension board according to the one embodiment of the present invention;

DESCRIPTION OF THE PREFERRED EMBODIMENTS

A printed circuit board according to one embodiment of the present invention and a method of manufacturing the printed circuit board will be described below with reference to the drawings.

[1] Embodiments

First, the configuration of a suspension board used for an actuator in a hard disc drive as one example of the printed circuit board according to the one embodiment of the present invention and a method of manufacturing the suspension board will be described.

(1) Configuration of Suspension Board

Figure 1:
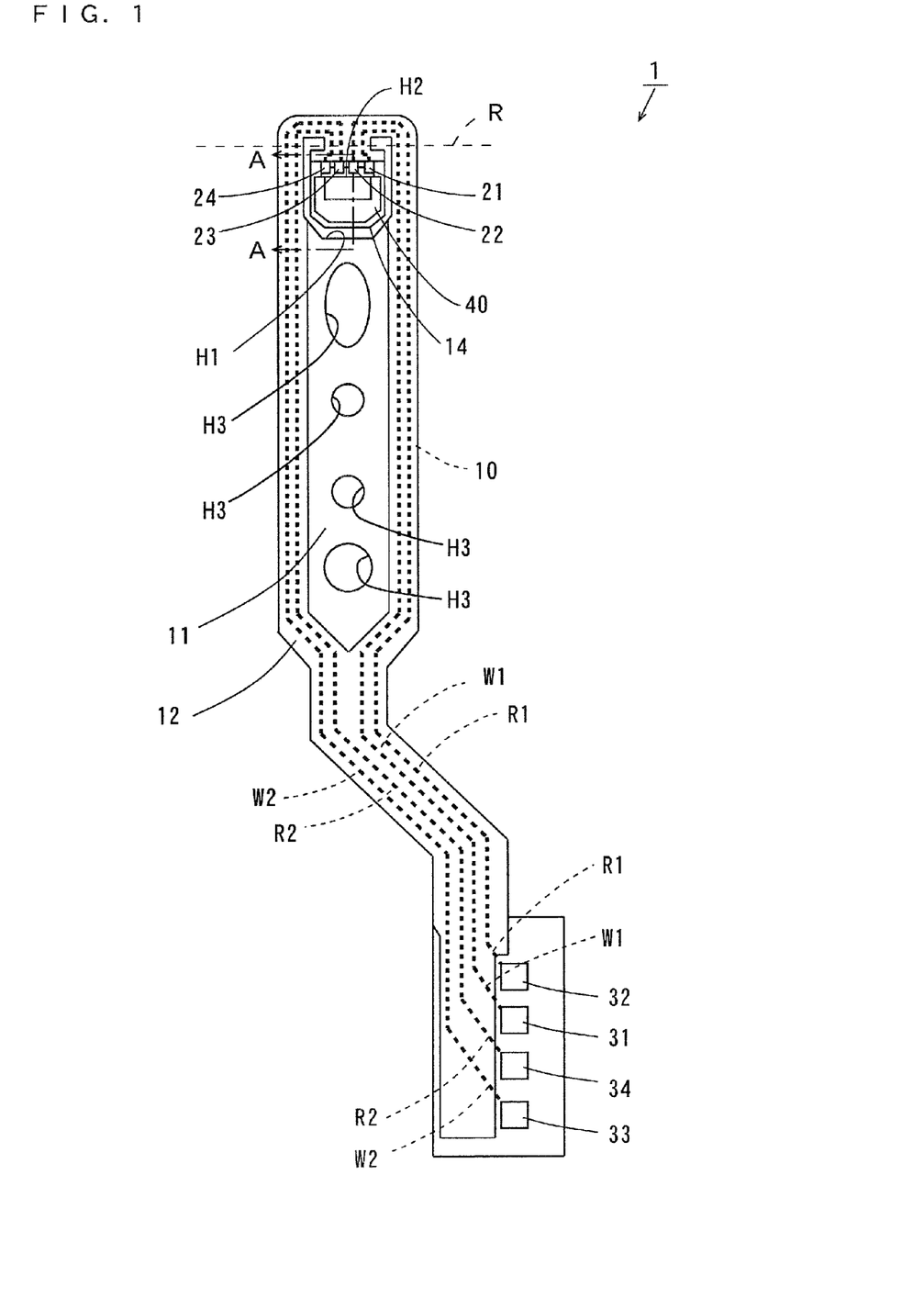
FIG. 1 is a top view of a suspension board according to one embodiment of the present invention.
Figure 2:
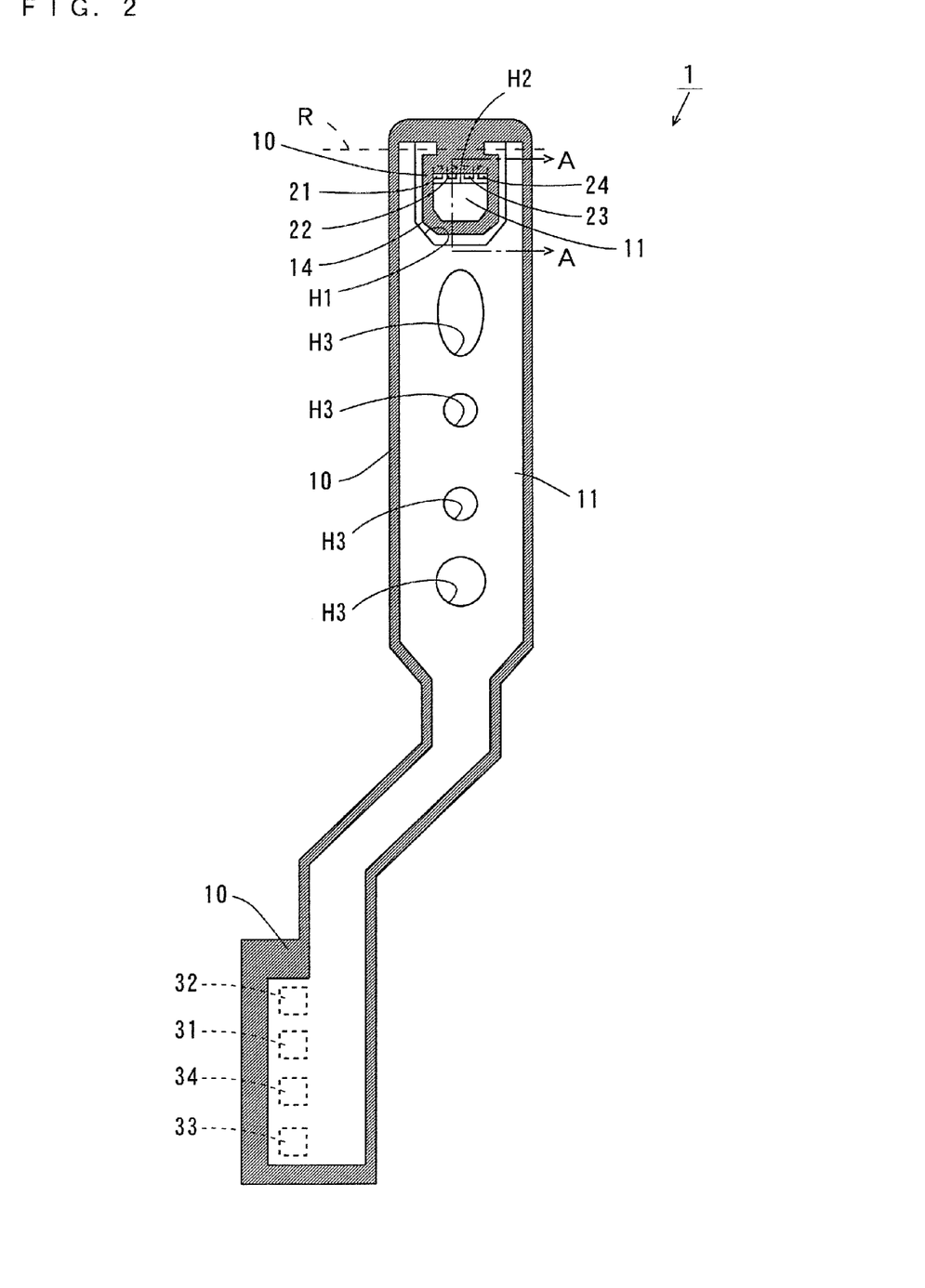
FIG. 2 is a bottom view of the suspension board of FIG. 1.

FIG. 1 is a top view of a suspension board according to the one embodiment of the present invention, and FIG. 2 is a bottom view of the suspension board of FIG. 1.

As shown in FIGS. 1 and 2, the suspension board 1 of this example mainly includes a metal support substrate 10, a first insulating layer 11, and a second insulating layer 12. The first insulating layer 11 has an upper surface and a lower surface. On the upper surface of the first insulating layer 11, write wiring traces W1, W2 and read wiring traces R1, R2 are formed as shown by the thick dotted lines of FIG. 1. The second insulating layer 12 is formed on part of the upper surface of the first insulating layer 11 so as to cover the write wiring traces W1, W2 and the read wiring traces R1, R2.

At the tip of the suspension board 1, a magnetic head supporting portion (hereinafter referred to as a tongue) 14 is provided by forming a substantially U-shaped opening H1. The tongue 14 is bent along the broken line R to form a predetermined angle with respect to the remaining part of the suspension board 1.

The metal support substrate 10 is formed by processing a metallic long-sized substrate. As shown in FIG. 2, the metal support substrate 10 is formed on the lower surface of the first insulating layer 11 to extend along the outer peripheral edge of the first insulating layer 11. Further, the metal support substrate 10 is formed on the lower surface of the first insulating layer 11 to extend along the outer peripheral edge of the tongue 14.

Four electrode pads 21, 22, 23, 24 are formed so as to be arranged in one direction at the end of the tongue 14. Further, a rectangular opening H2 extending parallel to the direction in which the four electrode pads 21, 22, 23, 24 are arranged is formed in the tongue 14.

The first insulating layer 11 includes a portion having a large thickness (hereinafter referred to as a thick portion) and a portion having a small thickness (hereinafter referred to as a thin portion). In the tongue 14, a substantially U-shaped reinforcing layer 40 is formed on the upper surface of the first insulating layer so as to overlap with the boundary between the thick portion and the thin portion. The detailed configuration of the tongue 14 will be described below.

In the region from the center of the suspension board 1 to the tongue 14, a plurality of openings H3 having a circular or an oval shape are formed. Four electrode pads 31, 32, 33, 34 are formed at the rear end of the suspension board 1. The electrode pads 21 to 24 on the tongue 14 and the electrode pads 31 to 34 at the rear end of the suspension board 1 are electrically connected by the write wiring trace W1, the read wiring trace R1, the write wiring trace W2, and the read wiring trace R2, respectively.

In the hard disc device (not shown) including the suspension board 1, an electric current flows through the pair of the write wiring traces W1, W2 at the time of writing information into a magnetic disc. Further, the electric current flows through the pair of the read wiring traces R1, R2 at the time of reading information from the magnetic disc.

(2) Configuration of Tongue 14 and its Peripheral Region

Figure 3:
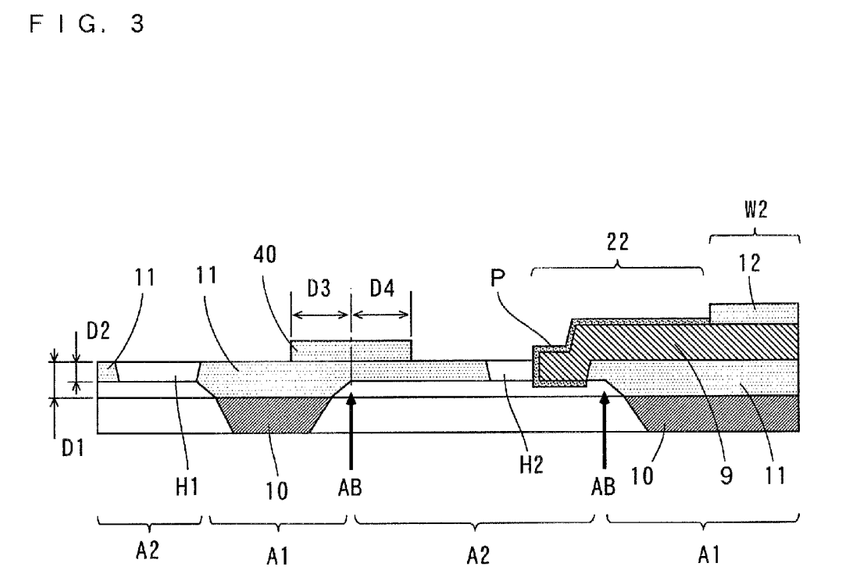
FIG. 3 is a vertical cross sectional view mainly showing the configuration of a tongue of FIG. 1.

FIG. 3 is a vertical cross-sectional view mainly showing the configuration of the tongue 14 of FIG. 1. The vertical cross-sectional view of FIG. 3 corresponds to the vertical cross-sectional view taken along the line A-A of the suspension board 1 of FIGS. 1 and 2.

As shown in FIG. 3, the first insulating layer 11 includes thick portions A1 having a thickness D1 and thin portions A2 having a thickness D2 smaller than the thickness D1 of the thick portions A1. The metal support substrate 10 is provided on the lower surface of the thick portions A1. The metal support substrate 10 is not provided on the lower surface of the thin portions A2.

In the tongue 14, the opening H2 is formed in the thin portions A2. At least part of each electrode pad 21, 22, 23, 24 overlaps with the opening H2 and the thin portions A2. Therefore, in the opening H2, part of each electrode pad 21, 22, 23, 24 is exposed in the lower space. As a result, dielectric loss at the electrode pads 21, 22, 23, 24 is more sufficiently reduced. In FIG. 3, the state where the end of the electrode pad 22 is exposed in the lower space is shown.

Steps are formed at boundaries AB between the thick portions A1 and the thin portions A2. Because stress is easily concentrated at the steps, damage such as a crack is more likely to occur. Therefore, in the present embodiment, the reinforcing layer 40 is formed on at least the partial region of the upper surface of the first insulating layer 11 so as to overlap with the boundary AB between the thick portion A1 and the thin portion A2.

(3) Method of Manufacturing Suspension Board 1

Figure 4:
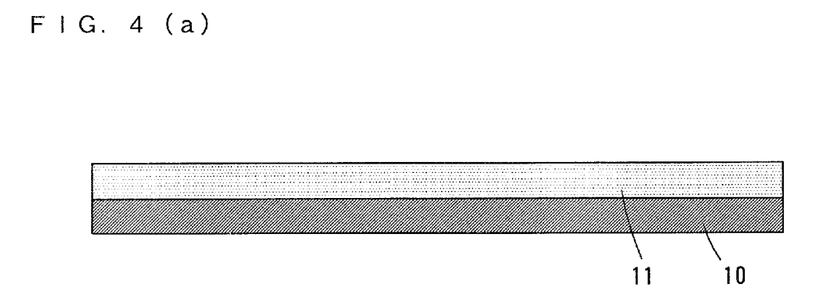
Figure 5:
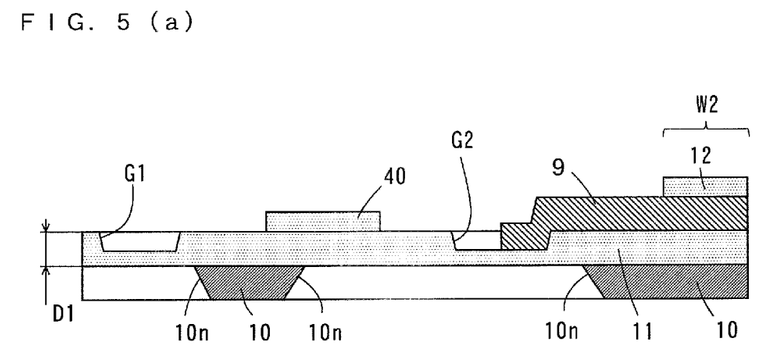

FIGS. 4 and 5 are vertical cross-sectional views showing the method of manufacturing the suspension board 1 according to the one embodiment of the present invention. The vertical cross-sectional views of FIGS. 4 and 5 correspond to the vertical cross-sectional views taken along the line A-A of FIGS. 1 and 2 in each of the steps of manufacturing the suspension board 1.

First, a long-sized substrate made of stainless steel (SUS) is prepared as the metal support substrate 10. As the metal support substrate 10, a long-sized substrate made of another metal material such as aluminum (A1) may be used instead of stainless steel. The thickness of the metal support substrate 10 is not less than 15 μm nor more than 25 μm, for example.

Next, as shown in FIG. 4 (a), the first insulating layer 11 made of photosensitive polyimide resin is formed on the metal support substrate 10. The first insulating layer 11 may be formed of another resin material such as epoxy resin, acrylic resin, polyether nitrile resin, polyether sulfone resin, polyethylene terephthalate resin, polyether naphthalate resin or polyvinyl chloride resin instead of polyimide resin. The thickness D1 of the first insulating layer 11 is not less than 8 μm nor more than 12 μm, for example.

Thereafter, as shown in FIG. 4 (b), a plurality of recesses corresponding respectively to the openings H1, H2, H3 of FIG. 1 are formed in predetermined regions on the upper surface of the first insulating layer 11 by gradation exposure. In this case, the gradation of light (intensity) used for the exposure is adjusted, whereby the depth of the plurality of recesses can be adjusted. Therefore, the thickness of the first insulating layer 11 in the regions where the plurality of recesses are formed is adjusted to not less than 0.5 μm nor more than 7 μm, for example. In FIG. 4 (b), only recesses G1, G2 corresponding to the openings H1, H2 of FIG. 1, respectively are shown. Further, the recesses G1, G2 may be formed by etching the upper surface of the first insulating layer 11 locally.

Then, as shown in FIG. 4 (c), a conductor layer 9 having a predetermined pattern is formed on the first insulating layer 11. The conductor layer 9 of this example is made of copper (Cu) and includes four lines of the conductor traces. Part of (one end of) each conductor trace is positioned in the recess G2.

The thickness of the conductor layer 9 is not less than 7 μm nor more than 15 μm, for example. The conductor layer 9 may be formed using a semi-additive method, or may be formed using another method such as a subtractive method. The conductor layer 9 can be formed using not only copper but also another metal such as gold (Au) or aluminum, or an alloy such as a copper alloy or an aluminum alloy.

Next, as shown in FIG. 4 (d), the second insulating layer 12 and the reinforcing layer 40 that are made of polyimide resin are formed in predetermined regions on the upper surface of the first insulating layer 11. The thickness of the second insulating layer 12 and the reinforcing layer 40 that are made of polyimide resin is not less than 2 μm nor more than 15 μm, for example.

The region where the second insulating layer 12 is formed is set to cover the portion excluding the both ends of each conductor trace in the conductor layer 9. Portions of the four conductor traces covered by the second insulating layer 12 are constituted as the write wiring trace W1, W2 and the read wiring trace R1, R2, respectively.

The boundary AB is formed by the etching process of the first insulating layer described below. The region where the reinforcing layer 40 is formed is set to include an area having a constant width D3 on the thick portion A1 side and an area having a constant width D4 on the thin portion A2 side, with the boundary AB as the center of such a region. The boundary AB is indicated by the thick dotted arrow in FIG. 4 (d). The constant widths D3, D4 are set to not less than 10 μm. In this example, the constant widths D3, D4 are 30 μm.

Further, in the upper surface of the first insulating layer 11, the reinforcing layer 40 may be formed in all regions excluding the region where the electrode pads 21 to 24 and 31 to 34 and the openings H1, H2, H3 of FIG. 1 are formed. In this case, the portion of the reinforcing layer 40 which covers the conductor layer 9 serves as the second insulating layer 12.

Then, as shown in FIG. 5 (a), portions of the metal support substrate 10 positioned in predetermined regions on the lower surface of the first insulating layer 11 are removed by etching. As a result, openings 10n are formed in the metal support substrate 10, and parts of the lower surface of the first insulating layer 11 are exposed in the space in the openings 10n.

In this state, predetermined regions on the lower surface of the first insulating layer 11 are etched in order to form the openings H1, H2, H3 (FIG. 1) of FIG. 1. In this case, in the first insulating layer 11, the portions exposed in the space in the openings 10n of the metal support substrate 10 are etched by a certain amount. On the other hand, the regions on the lower surface of the first insulating layer 11, which overlap with the metal support substrate 10 are not etched.

The regions where a plurality of recesses G1, G2 are formed on the upper surface of the first insulating layer 11 overlap with the regions in the openings 10n on the lower surface of the first insulating layer 11. Therefore, part of the first insulating layer 11 is etched by a certain amount, and thus the openings H1, H2, H3 of FIG. 1 are formed in the regions where the aforementioned plurality of recesses are formed. When the openings H1, H2, H3 (FIG. 1) are formed in the first insulating layer 11, the etching of the first insulating layer 11 is stopped. In FIG. 5 (b), only the openings H1, H2 of FIG. 1 are shown.

After the formation of the openings H1, H2, H3, as shown in FIG. 5 (b), the thickness D2 of the first insulating layer 11 where etching is performed becomes smaller than the thickness D1 of the first insulating layer 11 where etching is not performed. Thus, the thick portions A1 and the thin portions A2 are formed. The thickness D2 of the thin portions A2 is not less than 1 μm nor more than 5 μm, for example. Accordingly, the openings H1, H2, H3 are formed in the thin portions A2.

Finally, as shown in FIG. 5 (c), a gold plating P is formed so as to cover the surface of the both ends of each conductor trace in the conductor layer 9. Thus, as shown in FIGS. 1 to 3, the four electrode pads 21,22,23,24 are formed in the tongue 14. Additionally, the four electrode pads 31, 32, 33, 34 are formed at the rear end of the suspension board 1. The electrode pad 22 is illustrated in FIG. 5 (c).

(4) Effect (4-a) In the suspension board 1 described above, the thickness D2 of the thin portions A2 is smaller than the thickness D1 of the thick portions A1. In this case, a step is formed at each of the two respective boundaries AB between the thick portions A1 and the thin portions A2. Because stress is easily concentrated at the steps, the damage is more likely to occur.

Even in this case, the reinforcing layer 40 is formed on the upper surface of the first insulating layer 11 so as to overlap with one of the boundaries AB. Thus, the boundary AB between the thick portion A1 and the thin portion A2 and its peripheral portion are reinforced by the reinforcing layer 40. As a result, the stress to be concentrated at the step is distributed by the reinforcing layer 40, so that the damage is prevented from occurring at the step of the first insulating layer 11.

(4-b) The region where the reinforcing layer 40 is formed on the upper surface of the first insulating layer 11 is formed to be flat. Therefore, the reinforcing layer 40 is formed to be flat. Thus, the reinforcing layer 40 can easily be formed on the upper surface of the first insulating layer 11. Additionally, because the step is not formed at the reinforcing layer 40, the damage is prevented from occurring at the reinforcing layer 40.

(4-c) In the example of FIG. 3, the other boundary AB between the thick portion A1 and the thin portion A2 is formed even in the portion of the first insulating layer 11 in which the reinforcing layer 40 is not formed. The conductor layer 9 is formed so as to cover this boundary AB. In this case, the steps in the first insulating layer 11 are reinforced by the reinforcing layer 40 and the conductor layer 9. As a result, the damage is more sufficiently prevented from occurring at the steps of the first insulating layer 11.

(4-d) In the examples of FIGS. 4 and 5, the second insulating layer 12 and the reinforcing layer 40 are formed of the same material (polyimide). This allows the reinforcing layer 40 to be formed in the same step as the second insulating layer 12 (See FIG. 4 (d).) in manufacturing of the suspension board 1. Thus, it is not necessary to provide the step separately in order to form the reinforcing layer 40. As a result, the increase in the number of manufacturing steps and the production cost due to the formation of the reinforcing layer 40 is prevented.

(4-e) In the suspension board 1 described above, the reinforcing layer 40 made of polyimide resin is used. The reinforcing layer 40 made of polyimide resin has a sufficient flexibility. As a result, the reduction in flexibility of the suspension board 1 is suppressed.

(5) Another Example of Configuration

Figure 6:
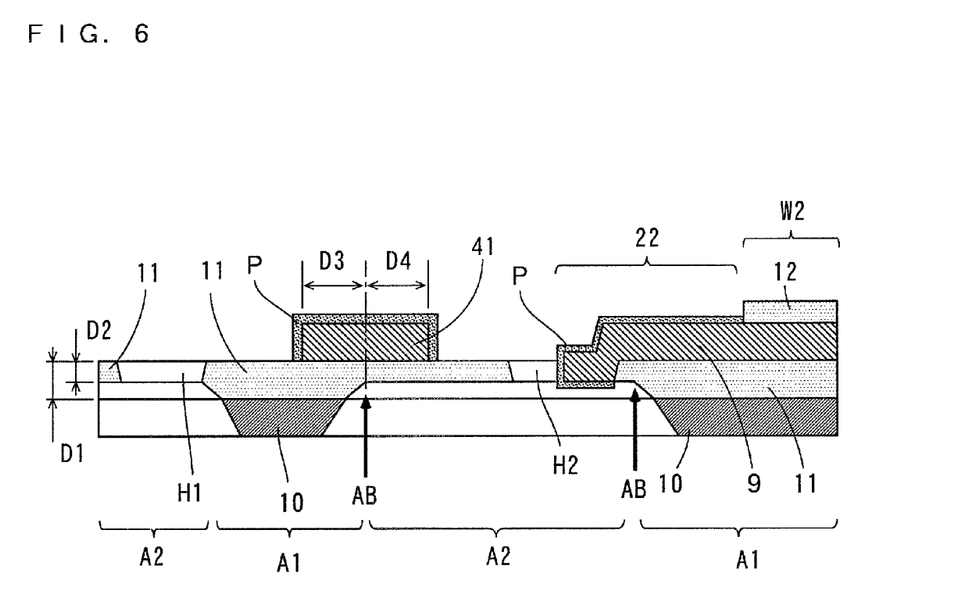
FIG. 6 is a vertical cross sectional view showing another example of the configuration of the suspension board, and FIGS. 7 (a) and 7 (b) are vertical cross sectional views showing yet another example of the configuration of the suspension board.

In the foregoing, while the example of using the reinforcing layer 40 made of polyimide resin for the suspension board 1 has been described, the reinforcing layer made of copper (Cu) may be used for the suspension board 1. FIG. 6 is a vertical cross-sectional view showing another example of the configuration of the suspension board 1. The vertical cross-sectional view of FIG. 6 corresponds to the vertical cross-sectional view taken along the line A-A of the suspension board 1 of FIGS. 1 and 2.

In the example of FIG. 6, a reinforcing layer 41 made of copper is formed on the upper surface of the first insulating layer 11 so as to overlap with one of with the boundaries AB. The thickness of the reinforcing layer 41 made of copper is not less than 7 μm nor more than 15 μm, for example.

Similarly to the region where the reinforcing layer 40 is formed as described above, the region where the reinforcing layer 41 is formed is set to include an area having the constant width D3 on the thick portion A1 side and an area having the constant width D4 on the thin portion A2 side, with the boundary AB as the center of the region. The constant widths D3, D4 are set to not less than 10 μm, respectively. In this example, the constant widths D3, D4 are 30 μm, respectively.

When the reinforcing layer 41 made of copper is used, the reinforcing layer 41 may corrode if the reinforcing layer 41 is exposed in the atmosphere. Therefore, in this example, the gold plating P is formed on the surface of the exposed reinforcing layer 41, in order to protect the reinforcing layer 41. The surface portion of the reinforcing layer 41 may be covered using a resin material such as polyimide resin instead of the gold plating P.

In this example, the conductor layer 9 and the reinforcing layer 41 are formed of the same material (copper). This allows the reinforcing layer 41 to be formed in the same step as the conductor layer 9 (See FIG. 4 (c).) in manufacturing of the suspension board 1. Further, the gold plating P can be formed on the surface of the reinforcing layer 41 in the same step as the step in which the gold plating P is formed on both ends of each conductor trace in the conductor layer 9. (See FIG. 5 (c).) Thus, it is not necessary to provide the step for forming the reinforcing layer 41 and the step for forming the gold plating P on the reinforcing layer 41 separately. As a result, the increase in the number of manufacturing steps and the production cost due to the formation of the reinforcing layer 41 and the formation of the gold plating P on the reinforcing layer 41 is prevented.

Furthermore, when the reinforcing layer 41 made of copper is used, the reinforcing layer 41 prevents the first insulating layer 11 from being bent at the boundary AB between the thick portion A1 and the thin portion A2. As a result, the damage is more sufficiently prevented from occurring at the step of the first reinforcing layer 11.

(6) Yet Another Example of Configuration

In the region where the conductor layer 9 is formed, the dielectric loss can be reduced by making the thickness of the first insulating layer 11 smaller. The thickness of the first insulating layer 11 positioned below the electrode pads 21, 22, 23, 24, for example, may be designed to be smaller than the remaining portion of the first insulating layer 11 not overlapping with the conductor layer 9.

Figure 7A:
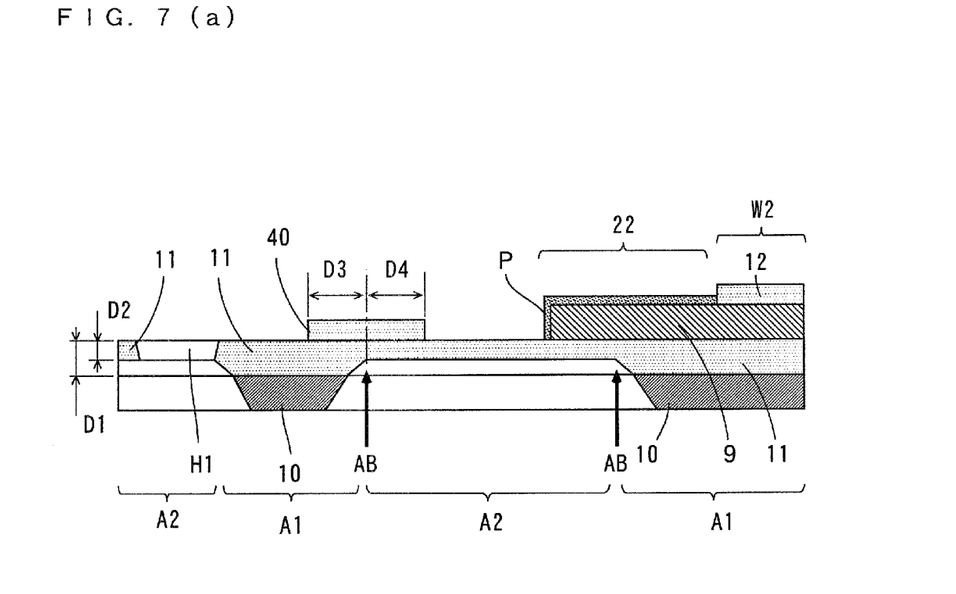
Figure 7B:
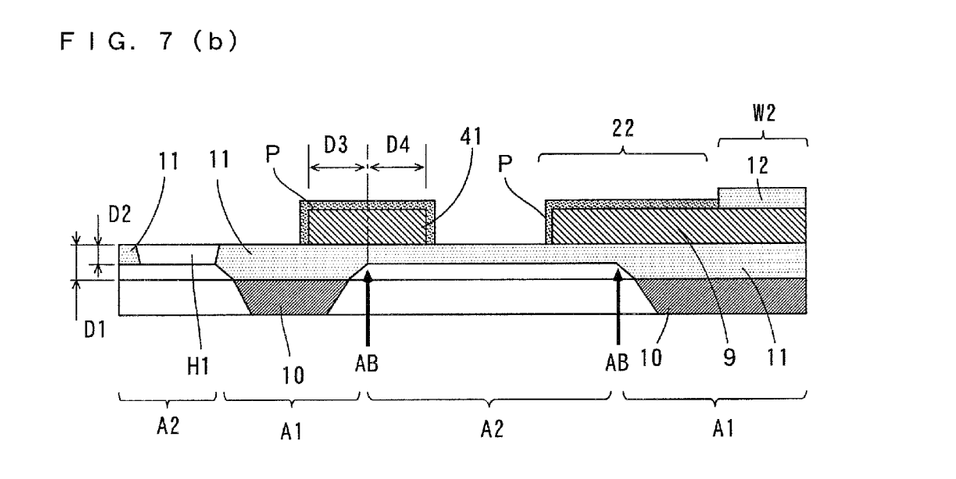

FIG. 7 is a vertical cross-sectional view showing yet another example of the configuration of the suspension board 1. The vertical cross-sectional views of FIG. 7 correspond to the vertical cross-sectional views taken along the line A-A of FIGS. 1 and 2 of the suspension board 1.

The suspension board 1 of FIG. 7 (a) has the same configuration as the suspension board 1 of FIG. 3 except that the opening H2 is not formed in the first insulating layer 11. Additionally, the suspension board 1 of FIG. 7 (b) has the same configuration as the suspension board 1 of FIG. 6 except that the opening H2 is not formed in the first insulating layer 11.

In the suspension boards 1 of FIGS. 7 (a) and 7 (b), the reinforcing layer 40, 41 is formed on the upper surface of the first insulating layer 11 so as to overlap with the corresponding boundary AB. Thus, the stress to be concentrated at the step is distributed by the reinforcing layer 40, 41, so that the damage at the step of the first insulating layer 11 is more sufficiently prevented from occurring.

(7) Another Embodiment

While in the above-mentioned embodiment, it is described that the metal support substrate 10 is formed below the thick portions A1, the invention is not limited to this. The metal support substrate 10 may not be formed below the thick portions A1.

(8) Correspondences Between Elements in the Claims and Parts in Embodiments

In the following paragraphs, non-limiting examples of correspondences between various elements recited in the claims below and those described above with respect to various preferred embodiments of the present invention are explained.

In the embodiments described above, the suspension board 1 is an example of a printed circuit board, the first insulating layer 11 is an example of a first insulating layer, the upper surface of the first insulating layer 11 is an example of a first surface, the lower surface of the first insulating layer 11 is an example of a second surface, the thick portion A1 is an example of a first portion, the thin portion A2 is an example of a second portion, the thickness D1 is an example of a thickness of the first portion, and the thickness D2 is an example of a thickness of the second portion.

Further, the conductor layer 9 is an example of a conductor layer, the boundary AB between the thick portion A1 and the thin portion A2 is an example of a boundary between the first portion and the second portion, the second insulating layer 12 is an example of a second insulating layer, and the metal support substrate 10 is an example of a support substrate. Furthermore, the area with the constant width D3 on the thick portion A1 side and the area with the constant width D4 on the thin portion A2 side, with the boundary AB on the upper surface of the first insulating layer 11 as the center, are examples of a partial region.

As each of various elements recited in the claims, various other elements having configurations or functions described in the claims can be also used.

[2] Inventive Examples

The suspension board 1 having the configuration of FIG. 7 (a) was fabricated as the suspension board 1 according to an inventive example 1 in accordance with the method of manufacturing described using FIGS. 3 to 5.

In the suspension board according to the inventive example 1, the thickness of the metal support substrate 10 was 18 μm. The thickness D1 of the thick portion A1 of the first insulating layer 11 was 10 μm and the thickness D2 of the thin portion A2 of the first insulating layer 11 was 3 μm. The thickness of the write wiring traces W1, W2 and the read wiring traces R1, R2 was 10 μm. The thickness of the reinforcing layer 40 made of polyimide resin was 5 μm. Further, in the suspension board according to the inventive example 1, the width corresponding to the width D3 of FIG. 7 (a) was set to 30 μm and the width corresponding to the width D4 of FIG. 7 (a) was set to 30 μm.

The suspension board 1 having the configuration of FIG. 7 (b) was fabricated as the suspension board according to the inventive example 2 in the same manner as the inventive example 1 except that the reinforcing layer 41 made of copper was used instead of the reinforcing layer 40 made of polyimide resin.

In the suspension board according to the inventive example 2, the thickness of the metal support substrate 10 was 18 μm. The thickness D1 of the thick portion A1 of the first insulating layer 11 was 10 μm and the thickness D2 of the thin portion A2 of the first insulating layer was 3 μm. The thickness of the write wiring traces W1, W2 and the read wiring traces R1, R2 was 10 μm. The thickness of the reinforcing layer 41 made of copper was 10 μm. Further, in the suspension board according to inventive example 2, the width corresponding to the width D3 of FIG. 7 (b) was set to 30 μm and the width corresponding to the width D4 of FIG. 7 (b) was set to 30 μm.

The suspension boards according to the inventive examples 1 and 2 were fabricated as described above and were attached to hard disc drives, respectively. In this state, the hard disc devices were operated for a predetermined period of time and then the suspension boards according to the inventive examples 1 and 2 were removed from the hard disc devices, respectively. The removed suspension boards according to the inventive examples 1 and 2 were observed. As a result, the damage such as a crack did not occur at the boundaries AB overlapping with the reinforcing layers 40, 41 for either of the suspension boards according to the inventive examples 1 and 2.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A printed circuit board comprising:
a first insulating layer that has first and second surfaces and includes a first portion and a second portion having a smaller thickness than a thickness of said first portion;
a conductor layer that is formed on said first surface of said first insulating layer and has a predetermined pattern; and
a reinforcing layer that is formed in a partial region on said first surface of said first insulating layer so as to overlap with a first boundary portion of a boundary between said first portion and said second portion, wherein said reinforcing layer is an insulating layer being in contact with said first surface of said first insulating layer, and
at least part of said conductor layer is formed in another region excluding said partial region on one surface of said first insulating layer so as to overlap with a second boundary portion, which is different from the first boundary portion, of the boundary between said first portion and said second portion; a support substrate that is provided on said second surface of said first insulating layer to support said first insulating layer, wherein
said conductor layer is configured to be electrically connectable to a magnetic head.

2. The printed circuit board according to claim 1, wherein said partial region on said first surface of said first insulating layer is formed to be flat, and a step caused by the boundary between said first portion and said second portion is formed on said second surface of said first insulating layer.

3. The printed circuit board according to claim 1, wherein at least part of said conductor layer is formed so as to overlap with said second portion.

4. A method of manufacturing a printed circuit board, comprising the steps of:
forming a conductor layer that has a predetermined pattern on a first surface of a first insulating layer having the first surface and a second surface;
processing said first insulating layer to form a first portion and a second portion having a smaller thickness than a thickness of said first portion; and,
forming a reinforcing layer in a partial region on said first surface of said first insulating layer so as to overlap with a first boundary portion of a boundary between said first portion and said second portion, wherein said reinforcing layer is an insulating layer being in contact with said first surface of said first insulating layer, and wherein at least a part of said conductor layer is formed in another region excluding said partial region on one surface of said first insulating layer so as to overlap with a second boundary portion, which is different from the first boundary portion, of the boundary between said first portion and said second portion; a support substrate that is provided on said second surface of said first insulating layer to support said first insulating layer, wherein said conductor layer is configured to be electrically connectable to a magnetic head.

5. The method of manufacturing the printed circuit board according to claim 4, wherein
the step of processing said first insulating layer includes the step of forming said second portion and an opening so as to overlap with at least part of said conductor layer by etching a predetermined region of said second surface of said first insulating layer.

6. The method of manufacturing the printed circuit board according to claim 4, wherein
the step of processing said first insulating layer includes the step of forming said second portion so as to overlap with at least part of said conductor layer by etching a predetermined region of said second surface of said first insulating layer.

7. The method of manufacturing the printed circuit board according to claim 4, further comprising the step of forming a second insulating layer on said first surface of said first insulating layer so as to cover part of said conductor layer, wherein
said reinforcing layer is formed of the same material as said second insulating layer, and
the step of forming said second insulating layer and the step of forming said reinforcing layer are performed simultaneously.

8. The method of manufacturing the printed circuit board according to claim 4, wherein
said reinforcing layer is formed of the same material as said conductor layer, and
the step of forming said conductor layer and the step of forming said reinforcing layer are performed simultaneously.

9. A printed circuit board comprising:
a first insulating layer having a first surface and a second surface;
a wiring trace that is formed on said first surface of said first insulating layer;
an electrode pad that is formed to connect with an end of said wiring trace on said first surface of said first insulating layer;
an insulating layer for reinforcement that is formed on said first surface of said first insulating layer; and
a second insulating layer that is formed on said first surface of said first insulating layer so as to cover said wiring trace and not to cover said electrode pad,
wherein said first insulating layer includes first, second and third portions that are positioned to be arranged in one direction,
said second portion is positioned between said first portion and said third portion and has a smaller thickness than a thickness of each of said first and third portions,
said wiring trace includes a first conductor layer that is formed on said first surface of said first portion,
said electrode pad includes:
a second conductor layer that is formed in a first region of said first surface so as to overlap a boundary between said first portion and said second portion; and
a plating layer that covers said second conductor layer,
said first and second conductor layers are continuous with each other and in contact with said first surface, and
said insulating layer for reinforcement is formed in a second region of said first surface so as to overlap a boundary between said second portion and said third portion, and is in contact with said first surface.

10. A printed circuit board comprising:

a first insulating layer having a first surface and a second surface;

a wiring trace that is formed on said first surface of said first insulating layer;

an electrode pad that is formed to connect with an end of said wiring trace on said first surface of said first insulating layer;

an insulating layer for reinforcement that is formed on said first surface of said first insulating layer; and a second insulating layer that is formed on said first surface of said first insulating layer so as to cover said wiring trace and not to cover said electrode pad, wherein said first insulating layer includes first, second, and third portions that are positioned to be arranged in one direction, said second portion is positioned between said first portion and said third portion and has a smaller thickness than a thickness of each of said first and third portions, said wiring trace includes a first conductor layer that is formed on said first surface of said first portion, said electrode pad includes:

a second conductor layer that is formed in a first region of said first surface so as to overlap a boundary between said first portion and said second portion; and a plating layer that covers said second conductor layer, said first and second conductor layers are continuous with each other and in contact with said first surface, said insulating layer for reinforcement is formed in a second region of said first surface so as to overlap a boundary between said second portion and said third portion, and is in contact with said first surface, said second portion has an opening, and part of said electrode pad is positioned in said opening.

* * * * *